US012727412B2

(12) United States Patent
Bjelopavlic

(10) Patent No.: US 12,727,412 B2
(45) Date of Patent: Sep. 1, 2026

(54) ETCHING COMPOSITIONS

(71) Applicant: Fujifilm Electronic Materials U.S.A., Inc., N. Kingstown, RI (US)

(72) Inventor: Mick Bjelopavlic, Chandler, AZ (US)

(73) Assignee: Fujifilm Electronic Materials U.S.A., Inc., North Kingstown, RI (US)

( * ) Notice: Subject to any disclaimer, the term of this patent is extended or adjusted under 35 U.S.C. 154(b) by 452 days.

(21) Appl. No.: 18/109,905

(22) Filed: Feb. 15, 2023

(65) Prior Publication Data

US 2023/0274946 A1 Aug. 31, 2023

Related U.S. Application Data

(60) Provisional application No. 63/320,272, filed on Mar. 16, 2022, provisional application No. 63/314,624, filed on Feb. 28, 2022.

(51) Int. Cl.

| | |
|---|---|
| ***H10P 50/66*** | (2026.01) |
| ***C09K 13/06*** | (2006.01) |
| ***H10D 84/83*** | (2025.01) |
| *H10D 30/01* | (2025.01) |
| *H10D 30/43* | (2025.01) |
| *H10D 30/67* | (2025.01) |
| *H10D 62/10* | (2025.01) |
| *H10P 14/694* | (2026.01) |

(52) U.S. Cl.

CPC ............ *H10P 50/667* (2026.01); *C09K 13/06* (2013.01); *H10D 84/83* (2025.01); *H10D 30/014* (2025.01); *H10D 30/43* (2025.01); *H10D 30/6735* (2025.01); *H10D 30/6739* (2025.01); *H10D 30/6748* (2025.01); *H10D 30/6757* (2025.01); *H10D 62/121* (2025.01); *H10P 14/69433* (2026.01)

(58) Field of Classification Search

CPC ........... H01L 21/32134; H01L 21/0217; H01L 21/30608; C09K 13/06; H10D 84/83; H10D 30/014; H10D 30/43; H10D 30/6735; H10D 30/6739; H10D 30/6748; H10D 30/6757; H10D 62/121

USPC ........................................................ 438/753

See application file for complete search history.

(56) References Cited

U.S. PATENT DOCUMENTS

| | | | |
|---|---|---|---|
| 6,717,019 B2 | 4/2004 | Lassila | |
| 10,934,485 B2 | 3/2021 | Liu et al. | |
| 2014/0001145 A1 | 1/2014 | Mizutani et al. | |
| 2015/0075850 A1 | 3/2015 | Ohwada et al. | |
| 2020/0172808 A1* | 6/2020 | Bjelopavlic ............ | C09K 13/08 |

FOREIGN PATENT DOCUMENTS

| | | | |
|---|---|---|---|
| EP | 3537473 B1 * | 5/2024 | ......... H10D 30/6757 |
| WO | WO-2018148237 A1 * | 8/2018 | ............... C11D 3/43 |
| WO | WO 2020/252272 | 12/2020 | |
| WO | WO-2020252272 A1 * | 12/2020 | ............ C09K 13/06 |

OTHER PUBLICATIONS

International Preliminary Report on Patentability in International Appln. No. PCT/US2023/013095, mailed on Sep. 12, 2024, 7 pages.

International Search Report and Written Opinion in International Appln. No. PCT/US2023/013095, mailed on May 3, 2023, 8 pages.

* cited by examiner

*Primary Examiner* — Duy Vu N Deo

(74) *Attorney, Agent, or Firm* — Fish & Richardson P.C.

(57) ABSTRACT

The present disclosure is directed to etching compositions that are useful for, e.g., selectively removing silicon from a semiconductor substrate as an intermediate step in a multi-step semiconductor manufacturing process.

16 Claims, No Drawings

ETCHING COMPOSITIONS

CROSS-REFERENCE TO RELATED APPLICATIONS

The present application claims priority to U.S. Provisional Application Ser. No. 63/314,624, filed on Feb. 28, 2022 and U.S. Provisional Application Ser. No. 63/320,272, filed on Mar. 16, 2022, the contents of which are hereby incorporated by reference in their entirety.

FIELD OF THE DISCLOSURE

The present disclosure relates to etching compositions and processes of using etching compositions. In particular, the present disclosure relates to etching compositions that can selectively etch silicon in the presence of other exposed or underlying materials, such as metal conductors (e.g., copper), gate materials (e.g., SiGe), barrier materials, insulator materials (e.g., low-k dielectric materials).

BACKGROUND OF THE DISCLOSURE

The semiconductor industry is rapidly decreasing the dimensions and increasing the density of electronic circuitry and electronic components in microelectronic devices, silicon chips, liquid crystal displays, MEMS (Micro Electro Mechanical Systems), printed wiring boards, and the like. The integrated circuits within them are being layered or stacked with constantly decreasing thicknesses of the insulating layer between each circuitry layer and smaller and smaller feature sizes. As the feature sizes have shrunk, patterns have become smaller, and device performance parameters tighter and more robust. As a result, various issues which heretofore could be tolerated, can no longer be tolerated or have become more of an issue due to the smaller feature size.

In the production of advanced integrated circuits, to minimize problems associated with the higher density and to optimize performance, both high k and low k insulators, and assorted barrier layer materials have been employed.

Silicon (Si) can be utilized in the manufacturing of semiconductor devices, liquid crystal displays, MEMS (Micro Electro Mechanical Systems), printed wiring boards and the like. For example, it can be used as a sacrificial material in a process of manufacturing a multigate device, such as a multiple-gate field-effect transistor (FET) (e.g., a gate-all-around FET (GAA FET)). In particular, an epi-stack (i.e., an epitaxially grown stack) can be formed of alternating silicon (Si) and silicon germanium alloy (SiGe) layers, wherein the Si layers are the sacrificial layers and the SiGe layers are the channel layers. The Si layers can then be removed by selective etching (for example via a wet etching process), which also inadvertently recesses trenches into the bulk substrate due to the similarity of materials composing the sacrificial layers and the substrate. The SiGe layers can subsequently be formed into the nanowire channels suspended over the trenches. A thin gate dielectric is then disposed around the SiGe nanowire channels and over the recessed trenches of the substrate. Metal is then disposed over the dielectric to form the metal gate electrode of the GAA MOSFET.

SUMMARY OF THE DISCLOSURE

In the construction of semiconductor devices, silicon (Si) frequently needs to be etched. In the various types of uses and device environments of Si, other layers are in contact with or otherwise exposed at the same time as this material is etched. Highly selective etching of the Si in the presence of these other materials (e.g. metal conductors, dielectrics, channel materials, gate materials, and hard masks) is typically needed for device yield and long life.

The present disclosure relates to compositions and processes for selectively etching Si relative to hard mask layers, gate materials (e.g., SiGe, SiN, poly-Si, or SiOx) and/or low-k dielectric layers (e.g., SiN, poly-Si, SiOx, carbon doped oxide, or SiCO) that are present in the semiconductor device. More specifically, the present disclosure relates to compositions and processes for selectively etching Si relative to SiGe and/or SiN.

In one aspect, this disclosure features an etching composition that includes a) at least one quaternary ammonium hydroxide or a salt thereof; b) at least one alkanolamine; c) at least one SiGe corrosion inhibitor comprising 11-mercaptoundecylphosphoric acid, 8-mercaptooctanoic acid, 6-mercaptohexanoic acid, 12-mercaptododecanoic acid, 8-quinolinylboronic acid, 8-aminoquinoline, 8-quinolinecarboxylic acid, 8-quinolinethiol, 2,8-quinolinediol, 8-quinolinylacetic acid, 8-quinolinesulfonic acid, 2-methyl-8-quinolinol, 5-hydroxyquinoline, or 6-hydroxyquinolinea mercapto-containing acid, a substituted quinoline, or a salt thereof; d) at least one polymerized naphthalene sulfonic acid; e) at least one organic solvent; and f) water.

In another aspect, this disclosure features an etching composition that includes a) at least one quaternary ammonium hydroxide or a salt thereof; b) at least one alkanolamine; c) at least one SiGe corrosion inhibitor comprising a mercapto-containing acid, a substituted quinoline, or a salt thereof; d) at least one polymerized naphthalene sulfonic acid; e) at least one organic solvent; and f) water.

In another aspect, this disclosure features a method that includes contacting a semiconductor substrate containing a Si film with an etching composition described herein to substantially remove the Si film.

In still another aspect, this disclosure features an article formed by the method described above, in which the article is a semiconductor device (e.g., an integrated circuit).

DETAILED DESCRIPTION OF THE DISCLOSURE

As defined herein, unless otherwise noted, all percentages expressed should be understood to be percentages by weight to the total weight of the composition. Unless otherwise noted, ambient temperature is defined to be between about 16 and about 27 degrees Celsius (° C.). As used herein, the terms "layer" and "film" are used interchangeably.

In general, the disclosure features an etching composition (e.g., an etching composition for selectively removing Si) that includes a) at least one quaternary ammonium hydroxide or a salt thereof; b) at least one alkanolamine; c) at least one SiGe corrosion inhibitor; d) at least one polymerized naphthalene sulfonic acid; e) at least one organic solvent; and f) water.

In some embodiments, the etching composition of this disclosure can include at least one (e.g., two, three, or four) quaternary ammonium hydroxide or a salt thereof. The quaternary ammonium hydroxide or a salt thereof described herein can be a tetraalkylammonium hydroxide, or a salt thereof. In some embodiments, each alkyl group in the tetraalkylammonium hydroxide, independently, is a $C_1$-$C_{18}$ alkyl optionally substituted by OH or aryl (e.g., phenyl). Examples of suitable tetraalkylammonium hydroxides or a salt thereof include tetramethylammonium hydroxide, tetraethylammonium hydroxide, tetrapropylammonium hydroxide, tetrabutylammonium hydroxide, benzyltrimethyl ammonium hydroxide, methyltriethyl ammonium hydroxide, ethyltrimethyl ammonium hydroxide (ETMAH), 2-hydroxyethyltrimethyl ammonium hydroxide, benzyltriethyl ammonium hydroxide, hexadecyltrimethyl ammonium hydroxide, or a salt thereof.

In some embodiments, the at least one quaternary ammonium hydroxide or a salt thereof is in an amount of at least about 0.1 wt % (e.g., at least about 0.2 wt %, at least about 0.4 wt %, at least about 0.5 wt %, at least about 0.6 wt %, at least about 0.8 wt %, at least about 1 wt %, at least about 2 wt %, at least about 3 wt %, at least about 4 wt %, or at least about 5 wt %) to at most about 10 wt % (e.g., at most about 9 wt %, at most about 8 wt %, at most about 7 wt %, at most about 6 wt %, at most about 5 wt %, at most about 4 wt %, at most about 3 wt %, at most about 2 wt %, at most about 1 wt %, or at most about 0.5 wt %) of the etching composition of this disclosure. Without wishing to be bound by theory, it is believed that the quaternary ammonium hydroxide or a salt thereof can facilitate and enhance the removal of Si on a semiconductor substrate during the etching process.

The etching composition of this disclosure can include at least one (e.g., two, three, or four) alkanolamine. As used herein, the term "alkanolamine" refers to a compound that include at least one (e.g., two, three, or four) amino group and at least one (e.g., two, three, or four) hydroxyl group. In some embodiments, the alkanolamine can be a compound of formula (I): $OR_3$—R—$N(R_1R_2)$ (I), in which R is $C_1$-$C_6$ straight or branched alkylene or oxyalkylene, and each of $R_1$, $R_2$, and $R_3$, independently is H, $C_3$-$C_6$ cycloalkyl, or $C_1$-$C_6$ alkyl optionally substituted by OH or $NH_2$. Examples of suitable alkanolamines include N-methyl ethanolamine (NMEA), monoethanolamine (MEA), diethanolamine, triethanolamine, triisopropanolamine, 2-(2-aminoethylamino) ethanol (also known as aminoethylethanolamine or AEEA), 2-(2-aminoethoxy)ethanol (AEE), N-ethyl ethanolamine, N,N-dimethyl ethanolamine, N,N-diethyl ethanolamine, N-methyl diethanolamine, N-ethyl diethanolamine, diisopropanolamine, or cyclohexylamine diethanol.

In some embodiments, the at least one alkanolamine can be from at least about 0.01 wt % (e.g., at least about 0.05 wt %, at least about 0.1 wt %, at least about 0.5 wt %, at least about 1 wt %, at least about 2 wt %, at least about 3 wt %, at least about 4 wt %, or at least about 5 wt %) to at most about 10 wt % (e.g., at most about 9 wt %, at most about 8 wt %, at most about 7 wt %, at most about 6 wt %, at most about 5 wt %, at most about 4 wt %, at most about 3 wt %, at most about 2 wt %, or at most about 1 wt %) of the etching composition of this disclosure. Without wishing to be bound by theory, it is believed that the alkanolamine can reduce or minimize the removal of other exposed materials on a semiconductor substrate during the etching process of a Si layer.

In general, the etching composition of this disclosure can include at least one (e.g., two, three, or four) SiGe corrosion inhibitor. In some embodiments, the SiGe corrosion inhibitor can include a mercapto-containing acid, a substituted quinoline, or a salt thereof. In some embodiments, the mercapto-containing acid can be a mercapto-containing phosphoric acid or a mercapto-containing carboxylic acid. Examples of suitable mercapto-containing acid can include 11-mercaptoundecylphosphoric acid, 8-mercaptooctanoic acid, 6-mercaptohexanoic acid, 11-mercaptoundecanoic acid, and 12-mercaptododecanoic acid. In some embodiments, the substituted quinoline includes a quinoline substituted by OH, $NH_2$, COOH, SH, $CH_2COOH$, $SO_3H$, or a boronic acid group. Examples of suitable substituted quinolines include 8-quinolinylboronic acid, 8-aminoquinoline, 8-quinolinecarboxylic acid, 8-quinolinethiol, 2,8-quinolinediol, 8-quinolinylacetic acid, 8-quinolinesulfonic acid, 2-methyl-8-quinolinol, 5-hydroxyquinoline, 6-hydroxyquinoline, and 8-hydroxyquinoline.

In some embodiments, the at least one SiGe corrosion inhibitor can be from at least about 0.01 wt % (e.g., at least about 0.02 wt %, at least about 0.05 wt %, at least about 0.1 wt %, at least about 0.2 wt %, at least about 0.5 wt %, or at least about 1 wt %) to at most about 3 wt % (e.g., at most about 2.5 wt %, at most about 2 wt %, at most about 1.5 wt %, at most about 1 wt %, at most about 0.8 wt %, at most about 0.6 wt %, at most about 0.5 wt %, at most about 0.4 wt %, at most about 0.2 wt %, or at most about 0.1 wt %) of the etching composition of this disclosure. Without wishing to be bound by theory, it is believed that the SiGe corrosion inhibitor can reduce or minimize the corrosion or removal of SiGe on a semiconductor substrate.

In some embodiments, the etching composition of this disclosure can optionally include at least one (e.g., two, three, or four) polymerized naphthalene sulfonic acid (or poly(naphthalene sulfonic acid)), e.g., as a surfactant or selective inhibitor (such as a SiN corrosion inhibitor). In some embodiments, the polymerized naphthalene sulfonic acid can be a sulfonic acid having the following chemical structure:

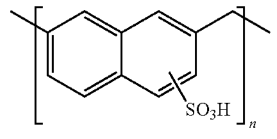

in which n is 3, 4, 5, or 6. Commercially available examples of such the polymerized naphthalene sulfonic acids include Takesurf A-47 series products available from Takemoto Oil & Fat Co., Ltd.

In some embodiments, the at least one polymerized naphthalene sulfonic acid can be from at least about 0.01 wt % (e.g., at least about 0.02 wt %, at least about 0.05 wt %, at least about 0.1 wt %, at least about 0.2 wt %, at least about 0.5 wt %, or at least about 1 wt %) to at most about 3 wt % (e.g., at most about 2.5 wt %, at most about 2 wt %, at most about 1.5 wt %, at most about 1 wt %, at most about 0.8 wt %, at most about 0.6 wt %, at most about 0.5 wt %, at most about 0.4 wt %, at most about 0.2 wt %, or at most about 0.1 wt %) of the etching composition of this disclosure. Without wishing to be bound by theory, it is believed that the polymerized naphthalene sulfonic acid can selectively inhibit the removal of SiN, poly-Si, and SiCO when Si is removed from a semiconductor substrate using the etching composition of this disclosure.

In some embodiments, the etching composition of this disclosure can include at least one (e.g., two, three, or four) organic solvent. In some embodiments, the organic solvent can be a water soluble organic solvent. As defined herein, a "water soluble" substance (e.g., a water soluble organic solvent) refers to a substance having a solubility of at least 1% by weight in water at 25° C. In some embodiments, the organic solvent can be selected from the group consisting of water soluble alcohols (e.g., alkane diols or glycols such as alkylene glycols), water soluble ketones, water soluble esters, and water soluble ethers (e.g., glycol ethers). Examples of suitable organic solvents include glycerol, propylene glycol, hexylene glycol, 1,3-propanediol, ethylene glycol butyl ether, 3-methoxy-3-methyl-1-butanol, acetone, cyclohexanone, ethyl acetate, and propylene glycol monoethyl ether acetate.

In some embodiments, the at least one organic solvent can be from at least about 5 wt % (e.g., at least about 10 wt %, at least about 15 wt %, at least about 20 wt %, at least about 25 wt %, at least about 30 wt %, at least about 35 wt %, or at least about 40 wt %) to at most about 75 wt % (e.g., at most about 70 wt %, at most about 65 wt %, at most about 60 wt %, at most about 55 wt %, at most about 50 wt %, at most about 45 wt %, or at most about 40 wt %) of the etching composition.

In general, the etching composition of this disclosure can include water as a solvent. In some embodiments, the water can be de-ionized and ultra-pure, contain no organic contaminants and have a minimum resistivity of about 4 to about 17 mega Ohms, or at least about 17 mega Ohms. In some embodiments, the water is in an amount of from at least about 25 wt % (e.g., at least about 30% by weight, at least about 35% by weight, at least about 40% by weight, at least about 45% by weight, at least about 50% by weight, at least about 55% by weight, or at least about 60% by weight) to at most about 95 wt % (e.g., at most about 90 wt %, at most about 85 wt %, at most about 80 wt %, at most about 75 wt %, at most about 70 wt %, at most about 65 wt %, at most about 60 wt %, at most about 55 wt %, at most about 50 wt %, at most about 45 wt %, or at most about 40 wt %) of the etching composition. Without wishing to be bound by theory, it is believed that the etching composition of this disclosure should include a certain level of water (e.g., at least about 25 wt %) to keep all other components solubilized and to avoid reduction in the etching performance.

In some embodiments, the etching composition of this disclosure can have a pH of at least about 4 (e.g., at least about 4.2, at least about 4.4, at least about 4.5, at least about 4.6, at least about 4.8, at least about 5, at least about 5.2, at least about 5.4, at least about 5.5, at least about 5.6, at least about 5.8, or at least about 6) and/or at most about 8 (e.g., at most about 7.8, at most about 7.6, at most about 7.5, at most about 7.4, at most about 7.2, at most about 7, at most about 6.8, at most about 6.6, at most about 6.5, at most about 6.4, at most about 6.2, or at most about 6). Without wishing to be bound by theory, it is believed that an etching composition having a pH higher than 8 would not have sufficient Si selectivity relative to gate materials (e.g., SiGe) and/or low-k dielectric materials (e.g., SiN). Further, it is believed that an etching composition having a pH lower than 4 could decompose certain components in the composition due to strong acidity.

In addition, in some embodiments, the etching composition of the present disclosure can contain additives such as, pH adjusting agents, corrosion inhibitors, surfactants, additional organic solvents, biocides, and defoaming agents as optional components. Examples of suitable additives include alcohols (e.g., polyvinyl alcohol and sugar alcohols), organic acids (e.g., iminidiacetic acid, malonic acid, oxalic acid, succinic acid, and malic acid), and inorganic acids (e.g., boric acid). Examples of suitable defoaming agents include polysiloxane defoamers (e.g., polydimethylsiloxane), polyethylene glycol methyl ether polymers, ethylene oxide/propylene oxide copolymers, and glycidyl ether capped acetylenic diol ethoxylates (such as those described in U.S. Pat. No. 6,717,019, herein incorporated by reference). Examples of suitable surfactants can be cationic, anionic, nonionic, or amphoteric surfactants.

In general, the etching composition of the present disclosure can have a relatively high Si/Ge etch selectivity (i.e., a high ratio of Si etch rate over SiGe etch rate). In some embodiments, the etching composition can have a Si/SiGe etch selectivity of at least about 2 (e.g., at least about 3, at least about 4, at least about 5, at least about 6, at least about 7, at least about 8, at least about 9, at least about 10, at least about 15, at least about 20, at least about 30, at least about 40, or at least about 50) and/or at most about 500 (e.g., at most about 100).

In some embodiments, the etching compositions of the present disclosure can be substantially free of one or more of additive components, in any combination, if more than one. Such components are selected from the group consisting of polymers (e.g., non-ionic, cationic, or anionic polymers), oxygen scavengers, quaternary ammonium compounds (e.g., salts or hydroxides), amines, alkaline bases (such as NaOH, KOH, LiOH, $Mg(OH)_2$, and $Ca(OH)_2$), surfactants (e.g., cationic, anionic, or non-ionic surfactants), defoamers, fluorine-containing compounds (e.g., fluoride compounds or fluorinated compounds (such as fluorinated polymers/surfactants)), silicon-containing compounds such as silanes (e.g., alkoxysilanes), nitrogen-containing compounds (e.g., amino acids, amines, or imines (e.g., amidines such as 1,8-diazabicyclo[5.4.0]-7-undecene (DBU) and 1,5-diazabicyclo[4.3.0]non-5-ene (DBN))), abrasives (e.g., ceria abrasives, non-ionic abrasives, surface modified abrasives, or negatively/positively charged abrasive), plasticizers, oxidizing agents (e.g., peroxides such as hydrogen peroxide, and periodic acid), corrosion inhibitors (e.g., azole or non-azole corrosion inhibitors), electrolytes (e.g., polyelectrolytes), silicates, cyclic compounds (e.g., azoles (such as diazoles, triazoles, or tetrazoles), triazines, and cyclic compounds containing at least two rings, such as substituted or unsubstituted naphthalenes, or substituted or unsubstituted biphenylethers), chelating agents, buffering agents, acids such as organic acids (e.g., carboxylic acids such as hydroxycarboxylic acids, polycarboxylic acids, and sulfonic acid) and inorganic acids (e.g., sulfuric acid, sulfurous acid, nitrous acid, nitric acid, phosphorous acid, and phosphoric acid), salts (e.g., halide salts or metal salts), and catalysts (e.g., metal-containing catalysts). As used herein, a component that is "substantially free" from an etching composition refers to an ingredient that is not intentionally added into the etching composition. In some embodiments, the etching composition described herein can have at most about 1000 ppm (e.g., at most about 500 ppm, at most about 250 ppm, at most about 100 ppm, at most about 50 ppm, at most about 10 ppm, or at most about 1 ppm) of one or more of the above components that are substantially free from the etching composition. In some embodiments, the etching compositions described herein can be completely free of one or more of the above components.

The etching composition of this disclosure can be prepared by simply mixing the components together, or may be prepared by blending two compositions (each containing certain components of an etching composition described herein) in a kit.

In some embodiments, the present disclosure features a method of etching a semiconductor substrate containing at least one Si film. The method can include contacting a semiconductor substrate containing the at least one Si film with an etching composition of this disclosure to substantially remove the Si film. The method can further include rinsing the semiconductor substrate with a rinse solvent after the contacting step and/or drying the semiconductor substrate after the rinsing step. In some embodiments, the method does not substantially remove a metal conductor (e.g., Cu), a gate material (e.g., SiGe), or a dielectric material (e.g., SiN, polysilicon, or SiCO) in the semiconductor substrate. For example, the method does not remove more than about 5% by weight (e.g., more than about 3% by weight or more than about 1% by weight) of a metal conductor or a dielectric material in the semiconductor substrate.

In some embodiments, the etching method includes the steps of:

(A) providing a semiconductor substrate containing a Si film;
(B) contacting the semiconductor substrate with an etching composition described herein;
(C) rinsing the semiconductor substrate with one or more suitable rinse solvents; and
(D) optionally, drying the semiconductor substrate (e.g., by any suitable means that removes the rinse solvent and does not compromise the integrity of the semiconductor substrate).

The semiconductor substrates containing a Si film to be etched in this method can contain organic and organometallic residues, and a range of metal oxides, some or all of which may also be removed during the etching process.

Semiconductor substrates described herein (e.g., wafers) typically are constructed of silicon, silicon germanium, Group III-V compounds such as GaAs, or any combination thereof. The semiconductor substrates can additionally contain exposed integrated circuit structures such as interconnect features (e.g., metal lines and dielectric materials). Metals and metal alloys used for interconnect features include, but are not limited to, aluminum, aluminum alloyed with copper, copper, titanium, tantalum, cobalt, silicon, titanium nitride, tantalum nitride, and tungsten. The semiconductor substrates can also contain layers of interlayer dielectrics, polysilicon, silicon oxide, silicon nitride, silicon germanium, silicon carbide, titanium oxide, and carbon doped silicon oxides.

A semiconductor substrate can be contacted with the etching composition by any suitable method, such as placing the etching composition into a tank and immersing and/or submerging the semiconductor substrate into the etching composition, spraying the etching composition onto the semiconductor substrate, streaming the etching composition onto the semiconductor substrate, or any combinations thereof.

The etching composition of the present disclosure can be effectively used up to a temperature of about 85° C. (e.g., from about 20° C. to about 80° C., from about 55° C. to about 65° C., or from about 60° C. to about 65° C.). The etch rates of Si increase with temperature in this range, thus the processes at a higher temperature can be run for shorter times. Conversely, lower etching temperatures typically require longer etching times.

Etching times can vary over a wide range depending on the particular etching method, thickness, and temperature employed. When etching in an immersion batch type process, a suitable time range is, for example, up to about 10 minutes (e.g., from about 1 minute to about 7 minutes, from about 1 minute to about 5 minutes, or from about 2 minutes to about 4 minutes). Etching times for a single wafer process can range from about 30 seconds to about 5 minutes (e.g., from about 30 seconds to about 4 minutes, from about 1 minute to about 3 minutes, or from about 1 minute to about 2 minutes).

To further promote the etching ability of the etching composition of the present disclosure, mechanical agitation means can be employed. Examples of suitable agitation means include circulation of the etching composition over the substrate, streaming or spraying the etching composition over the substrate, and ultrasonic or megasonic agitation during the etching process. The orientation of the semiconductor substrate relative to the ground can be at any angle. Horizontal or vertical orientations are preferred.

Subsequent to the etching, the semiconductor substrate can be rinsed with a suitable rinse solvent for about 5 seconds up to about 5 minutes with or without agitation means. Multiple rinse steps employing different rinse solvents can be employed. Examples of suitable rinse solvents include, but are not limited to, deionized (DI) water, methanol, ethanol, isopropyl alcohol, N-methylpyrrolidinone, gamma-butyrolactone, dimethyl sulfoxide, ethyl lactate, and propylene glycol monomethyl ether acetate. Alternatively, or in addition, aqueous rinses with pH>8 (such as dilute aqueous ammonium hydroxide) can be employed. The rinse solvent can be applied using means similar to that used in applying an etching composition described herein. The etching composition may have been removed from the semiconductor substrate prior to the start of the rinsing step or it may still be in contact with the semiconductor substrate at the start of the rinsing step. In some embodiments, the temperature employed in the rinsing step is between 16° C. and 27° C.

Optionally, the semiconductor substrate is dried after the rinsing step. Any suitable drying means known in the art can be employed. Examples of suitable drying means include spin drying, flowing a dry gas across the semiconductor substrate, or heating the semiconductor substrate with a heating means such as a hotplate or infrared lamp, Maragoni drying, rotagoni drying, IPA drying, and any combinations thereof. Drying times will be dependent on the specific method employed but are typically on the order of 30 seconds up to several minutes.

In some embodiments, the etching method described herein further includes forming a semiconductor device (e.g., an integrated circuit device such as a semiconductor chip) from the semiconductor substrate obtained by the method described above.

While the invention has been described in detail with reference to certain embodiments thereof, it will be understood that modifications and variations are within the spirit and scope of that which is described and claimed.

The following example is provided to illustrate the principles and practice of the present disclosure more clearly. It should be understood that the present disclosure is not limited to the examples described.

EXAMPLE

General Procedure 1

Formulation Blending

Samples of etching compositions are prepared by adding, while stirring, to the calculated amount of the solvent the remaining components of the formulation.

General Procedure 2

Materials and Methods

Blanket film etch rate measurements on films are carried out using commercially available unpatterned 300 mm diameter wafers that are diced into 0.5"×1.0" test coupons for evaluation. Primary blanket film materials used for testing include 1) a polysilicon (poly-Si) film of about 1000 Å thickness deposited on a silicon substrate; 2) a SiN film of about 600 Å thickness deposited on a silicon substrate, and 3) a SiOx film of about 1200 Å thickness deposited on a silicon substrate.

The blanket film test coupons are measured for pre-treatment and post-treatment thickness to determine blanket film etch rates. For the poly-Si, SiN, and SiOx blanket films, the film thicknesses are measured pre-treatment and post-treatment by Ellipsometry using a Woollam VASE.

General Procedure 3

Etching Evaluation with Beaker Test

All blanket film etch testing is carried out at 75° C. in a 600 mL glass beaker containing 200 g of a sample solution with continuous stirring at 250 rpm, with the Parafilm® cover in place at all times to minimize evaporative losses. All blanket test coupons having a blanket film exposed on one side to the sample solution are diced by diamond scribe into 0.5"×1.0" square test coupon size for beaker scale testing. Each individual test coupon is held into position using a single 4" long, locking plastic tweezers clip. The test coupon, held on one edge by the locking tweezers clip, is suspended into the 600 mL HDPE beaker and immersed into the 200 g test solution while the solution is stirred continuously at 250 rpm at 75° C. Immediately after each sample coupon is placed into the stirred solution, the top of the 600 mL HDPE beaker is covered and resealed with Parafilm®. The test coupons are held static in the stirred solution until the treatment time (0.5 minutes or 60 minutes) had elapsed.

After the treatment time in the test solution has elapsed, the sample coupons are immediately removed from the 600 mL HDPE beaker and rinsed. Specifically, the coupon is immersed in a 300 mL volume of ultra-high purity deionized (DI) water for 15 seconds with mild agitation, which is followed by immersion in 300 mL of isopropyl alcohol (IPA) for 15 seconds with mild agitation, and a final rinse by immersion in 300 mL of IPA for 15 seconds with mild agitation. After the final IPA rinse step, all test coupons are subject to a filtered nitrogen gas blow off step using a hand held nitrogen gas blower which forcefully removes all traces of IPA to produce a final dry sample for test measurements.

Example 1

Formulation Example 1 (FE-1) is prepared according to General Procedure 1, and evaluated according to General Procedures 2 and 3. The formulation of FE-1 is summarized in Table 1.

TABLE 1

| Composition | FE-1 |
| --- | --- |
| 20 wt % ETMAH aqueous solution | 25 wt % |
| 2-(2-aminoethoxy)ethanol | 34 wt % |
| Glycerol | 20 wt % |
| SiGe inhibitor | 0.9 wt % |
| SiN inhibitor | 0.1 wt % |
| DI water | 20 wt % |
| Total | 100 wt % |

ETMAH = ethyltrimethyl ammonium hydroxide

What is claimed is:

1. An etching composition, comprising:

at least one quaternary ammonium hydroxide or a salt thereof, wherein the at least one quaternary ammonium hydroxide or a salt thereof is in an amount of from about 0.1 wt % to about 10 wt % of the composition;

at least one alkanolamine, wherein the at least one alkanolamine is in an amount of from about 0.01 wt % to about 10 wt % of the composition;

at least one SiGe corrosion inhibitor comprising 11-mercaptoundecylphosphoric acid, 8-mercaptooctanoic acid, 6-mercaptohexanoic acid, 12-mercaptododecanoic acid, 8-quinolinylboronic acid, 8-aminoquinoline, 8-quinolinecarboxylic acid, 8-quinolinethiol, 2,8-quinolinediol, 8-quinolinylacetic acid, 8-quinolinesulfonic acid, 2-methyl-8-quinolinol, 5-hydroxyquinoline, or 6-hydroxyquinoline;

at least one polymerized naphthalene sulfonic acid;

at least one organic solvent; and water, wherein the composition is substantially free of fluorine-containing compounds.

2. The composition of claim 1, wherein the least one quaternary ammonium hydroxide or a salt thereof comprises a tetraalkylammonium hydroxide or a salt thereof.

3. The composition of claim 1, wherein the least one quaternary ammonium hydroxide or a salt thereof comprises tetramethylammonium hydroxide, tetraethylammonium hydroxide, tetrapropylammonium hydroxide, tetrabutylammonium hydroxide, benzyltrimethyl ammonium hydroxide, methyltriethyl ammonium hydroxide, ethyltrimethyl ammonium hydroxide, 2-hydroxyethyltrimethyl ammonium hydroxide, benzyltriethyl ammonium hydroxide, hexadecyltrimethyl ammonium hydroxide, or a salt thereof.

4. The composition of claim 1, wherein the at least one alkanolamine comprises N-methyl ethanolamine, monoethanolamine, diethanolamine, triethanolamine, triisopropanolamine, 2-(2-aminoethylamino)ethanol, 2-(2-aminoethoxy)ethanol, N-ethyl ethanolamine, N,N-dimethyl ethanolamine, N,N-diethyl ethanolamine, N-methyl diethanolamine, N-ethyl diethanolamine, diisopropanolamine, or cyclohexylaminediethanol.

5. The composition of claim 1, wherein the at least one SiGe corrosion inhibitor is in an amount of from about 0.01 wt % to about 3 wt % of the composition.

6. The composition of claim 1, wherein the at least one organic solvent comprises an alcohol or an alkylene glycol ether.

7. The composition of claim 6, wherein the at least one organic solvent comprises glycerol, propylene glycol, hexylene glycol, 1,3-propanediol, ethylene glycol butyl ether, 3-methoxy-3-methyl-1-butanol, acetone, cyclohexanone, ethyl acetate, or propylene glycol monoethyl ether acetate.

8. The composition of claim 1, wherein the at least one organic solvent is in an amount of from about 5 wt % to about 75 wt % of the composition.

9. The composition of claim 1, wherein the water is in an amount of from about 25 wt % to about 95 wt % of the composition.

10. The composition of claim 1, wherein the at least one polymerized naphthalene sulfonic acid comprises a sulfonic acid having a structure of

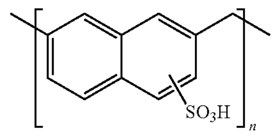

in which n is 3 to 6.

11. The composition of claim 1, wherein the at least one polymerized naphthalene sulfonic acid is in an amount of from about 0.01 wt % to about 3 wt % of the composition.

12. The composition of claim 1, wherein the composition has a pH of from about 4 to about 8.

13. An etching composition, comprising:

at least one quaternary ammonium hydroxide or a salt thereof;

at least one alkanolamine;

at least one SiGe corrosion inhibitor comprising a mercapto-containing acid, a substituted quinoline, or a salt thereof;

wherein the mercapto-containing acid comprises a mercapto-containing phosphoric acid or a mercapto-containing carboxylic acid, wherein the mercapto-containing acid comprises 11-mercaptoundecylphosphoric acid, 8-mercaptooctanoic acid, 6-mercaptohexanoic acid, or 12-mercaptododecanoic acid;

wherein the substituted quinoline comprises a quinoline substituted by $NH_2$, COOH, SH, $CH_2COOH$, $SO_3H$, or a boronic acid group;

at least one polymerized naphthalene sulfonic acid;

at least one organic solvent; and water, wherein the composition is substantially free of fluorine-containing compounds.

14. The composition of claim 13, wherein the substituted quinoline comprises 8-quinolinylboronic acid, 8-aminoquinoline, 8-quinolinecarboxylic acid, 8-quinolinethiol, 8-quinolinylacetic acid, or 8-quinolinesulfonic acid.

15. A method, comprising:

contacting a semiconductor substrate containing a Si film with a composition of claim 1 to substantially remove the Si film.

16. The method of claim 15, wherein the method does not substantially remove SiN or SiGe.

* * * * *